(12) United States Patent
Feng

(10) Patent No.: US 6,990,644 B2
(45) Date of Patent: Jan. 24, 2006

(54) ON CHIP TIMING ADJUSTMENT IN MULTI-CHANNEL FAST DATA TRANSFER

(75) Inventor: Kai Di Feng, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 544 days.

(21) Appl. No.: 10/063,394

(22) Filed: Apr. 18, 2002

(65) Prior Publication Data

US 2003/0197534 A1 Oct. 23, 2003

(51) Int. Cl.
G06F 17/50 (2006.01)
G01R 31/28 (2006.01)
H03L 7/00 (2006.01)
H03H 11/26 (2006.01)

(52) U.S. Cl. .................. 716/6; 716/4; 716/5; 714/724; 714/741; 327/156; 327/271

(58) Field of Classification Search .................... 716/4, 716/6; 327/271, 156, 141, 71; 714/752, 714/741, 738, 724, 700; 375/373, 371, 363, 375/362, 354, 347, 295
See application file for complete search history.

(56) References Cited

U.S. PATENT DOCUMENTS

| | | | | |
|---|---|---|---|---|
| 4,993,019 A | * | 2/1991 | Cole et al. | 370/362 |
| 5,043,596 A | * | 8/1991 | Masuda et al. | 327/297 |
| 5,184,027 A | * | 2/1993 | Masuda et al. | 327/149 |
| 5,388,060 A | * | 2/1995 | Adams et al. | 703/27 |
| 5,394,490 A | * | 2/1995 | Kato et al. | 385/14 |
| 5,525,914 A | * | 6/1996 | Cao et al. | 326/71 |
| 5,948,115 A | * | 9/1999 | Dinteman | 714/738 |
| 6,043,694 A | * | 3/2000 | Dortu | 327/156 |
| 6,323,711 B2 | * | 11/2001 | Truong et al. | 327/259 |
| 6,621,762 B1 | * | 9/2003 | Roohparvar | 365/233 |
| 6,857,089 B2 | * | 2/2005 | Schaber et al. | 714/724 |
| 2001/0047450 A1 | * | 11/2001 | Gillingham et al. | 711/105 |
| 2002/0000855 A1 | * | 1/2002 | Lee | 327/158 |
| 2002/0160558 A1 | * | 10/2002 | Ernst et al. | 438/200 |
| 2002/0175728 A1 | * | 11/2002 | DeRyckere et al. | 327/271 |
| 2002/0184577 A1 | * | 12/2002 | Chow et al. | 714/700 |
| 2003/0081709 A1 | * | 5/2003 | Ngo et al. | 375/362 |
| 2004/0153267 A1 | * | 8/2004 | Fishman et al. | 702/69 |
| 2004/0216024 A1 | * | 10/2004 | Jin et al. | 714/752 |

OTHER PUBLICATIONS

Hafed et al., "A high-throughput 5 GBPS timing and jitter test module featuring localized processing", Oct. 26-28, 2004, test Conference. Proceedings. International, pp.: 728-737.*

NN8902351, "Programmable memory controller", Feb. 1, 1989, IBM Technical disclosure bulletin, Volume No.: 31, Issue No.: 9, Page No.: 351-354.*

* cited by examiner

Primary Examiner—A. M. Thompson
Assistant Examiner—Helen Rossoshek
(74) Attorney, Agent, or Firm—Gibb I.P. Law Firm, LLC; Richard A. Henkler, Esq.

(57) ABSTRACT

A method and structure for an apparatus for maintaining signal integrity between integrated circuits residing on a printed circuit board. The apparatus has adjustable delay circuitry within the circuits and the adjustable delay circuitry adjusts the timing of signals processed within the circuit. A phase monitor connects to the circuits. The phase monitor detects phase differences between signals output by the circuits. A controller connected to the delay circuitry, the phase monitor, and the controller adjust the delay circuitry to compensate for the phase differences.

15 Claims, 7 Drawing Sheets

ON CHIP TIMING ADJUSTMENT IN MULTI-CHANNEL FAST DATA TRANSFER

BACKGROUND OF THE INVENTION

1. Field of the Invention

The present invention generally relates to chip timing adjustment and more particularly to a chip timing adjustment structure which is implemented by programmable delay units and configuration word settings.

2. Description of the Related Art

As the Baud rate increases, the timing performance of fast digital transfer systems becomes more and more critical. This is especially true for multi-channel, fast digital transfer systems because the timing concern in this kind of system is not only for data and clock information, but also for information between channels.

The following factors can cause timing uncertainty. The first factor that can cause timing uncertainty is driver and receiver chip procession variance. The devices used in a fast data transfer system must have a small size to reduce the propagation delay time and the parasitic capacitance. A small portion of geometric variance in a small sized device would cause a relatively big propagation delay time difference.

The second factor that can cause timing uncertainty is noise. A fast driver or receiver requires a wide bandwidth. The wide bandwidth results in more noise and large timing jitter on the transition edges since the noise rms value is proportional to the square root of the bandwidth. In the noisy environment, the clock falling edge or reading edge must be located as close as possible to the middle of a data bit duration in order to obtain a maximum jitters margin.

A third factor that can cause timing uncertainty is the difference of the length of the microstrip lines on a printed circuit board (PCB) between the driver and the receiver. A fast data transfer system must use microstrip lines on the PCB to reduce the attenuation and to reach the impedance matching. However, the signal speed in a microstrip line depends on the dielectric constant of the PCB and is much slower than the speed in vacuum or in air. This causes considerable timing differences for different lengths of microstrip lines in a PCB.

For example, in one structure, a 40 Gb/s data transfer is implemented by 8 channels in parallel, where the Baud rate of each channel is 5 Gb/s and the bit duration of 5 Gb/s is 200 ps. A very popular PCB material, RF4, has the relative dielectric constant of 3.5 to 4.5. Assume that the dielectric constant is between 3.5 and 4.5 (e.g., a middle value of 4). The signal speed in the transmission-line is reversely proportional to the square root of the relative dielectric constant. In such a structure the signal speed in the microstrip line (RF4) is about 67 ps/cm. This means that, if two microstrip lines have more than 1 cm length difference, the propagation delay time difference will be more than 67 ps. Compared with a bit duration time of 200 ps, this 67 ps difference cannot be ignored.

In an actual PCB layout, it is not feasible to keep all microstrip line channel lengths the same length. Therefore, even if the data bit signal and the clock in one channel have proper timing, timing differences would exist among different channels.

According to the problems describe above, even if the chips of a driver or receiver have excellent stand-alone timing performances (and good jitter budgets) when they are mounted on the PCB, serious timing problems could still exist because of driver and receiver chip processing variances, noise, and/or different microstrip line channel lengths. The invention described below overcomes these problems with a novel chip timing adjustment structure which is implemented by programmable delay units and configuration word settings.

BRIEF SUMMARY OF THE INVENTION

In view of the foregoing and other problems, disadvantages, and drawbacks of the conventional timing systems, the present invention has been devised, and it is an object of the present invention, to provide a structure and method for a chip timing adjustment structure which is implemented by programmable delay units and configuration word settings.

In order to attain the object(s) suggested above, there is provided, according to one aspect of the invention, an apparatus for maintaining signal integrity between integrated circuits residing on a printed circuit board. The apparatus has adjustable delay circuitry within the circuits, and the adjustable delay circuitry adjusts the timing of signals processed within the circuit. A phase monitor connects to the circuits and the phase monitor detects phase differences between signals output by the circuits. A controller connected to the delay circuitry and the phase monitor adjusts the delay circuitry to compensate for the phase differences.

The apparatus has first data lines connecting the circuits to each other and second data lines connecting the controller to the circuits. The second data lines transmit data at a slower rate than the first data lines. The apparatus has a serial data line connecting the controller to the circuits. At least one of the circuits in the apparatus is a receiver circuit. The receiver circuit has a plurality of channels and a configuration word interface connected to the channels and to the controller. The adjustable delay circuitry has at least one adjustable delay device within each of the channels. The configuration word interface controls the delay device to coordinate the signal timing of the channels. The apparatus also has delay registers between the delay device and the configuration word interface; the delay registers store information regarding the timing delay of an associated delay device. The apparatus in the configuration word interface is connected to the controller, and the controller supplies information to control the delay device. The configuration word interface permits dynamic control of the delay device. The configuration word interface includes a phase voltage converter. The apparatus having the adjustable delay device is a resistor-capacitor network. A Schmitt trigger is connected to the resistor-capacitor network or a digital-to-analog converter is connected to the resistor-capacitor network. Variable transistors can also be connected to the resistor-capacitor network.

BRIEF DESCRIPTION OF THE SEVERAL VIEWS OF THE DRAWINGS

The foregoing and other objects, aspects and advantages will be better understood from the following detailed description of a preferred embodiment(s) of the invention with reference to the drawings, in which:

FIG. 1(*b*) is a schematic diagram illustrating the two controllers communicating through fast data buses, transmitter, transmission line and receiver;

FIG. 1(*c*) is a system diagram of the invention;

DETAILED DESCRIPTION OF THE INVENTION

As mentioned above, even if the chips of a driver or receiver have excellent stand-alone timing performances (and good jitter budgets) when they are mounted on the PCB, serious timing problems could still exist because of driver and receiver chip processing variances, noise, and/or different microstrip line channel lengths. The invention described below overcomes these problems with a novel chip timing adjustment structure which is implemented by programmable delay units and configuration word settings. Thus, the invention provides a solution of "on-chip" timing adjustment using programmable delay units and configuration word settings.

Figure 1A:
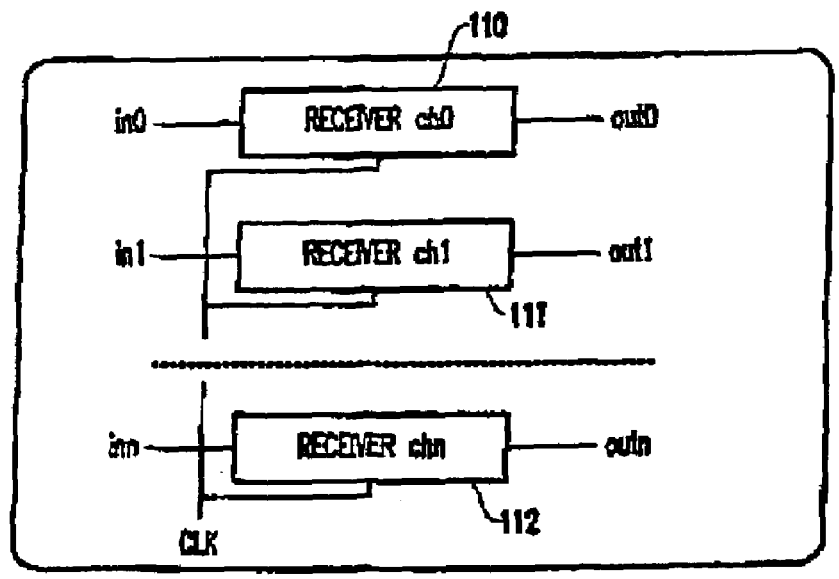
FIG. 1(*a*) is a schematic diagram of a conventional circuit that requires timing adjustment.

Referring now to FIG. 1(a), a system block diagram is shown. More specifically, FIG. 1(a) shows the block diagram of a receiver having N parallel channels 110–112. Good timing results are required, not only for the input bit signal and clock of each channel, but also among the outputs of all channels. Due to the noise jitters, procession variation and the length difference of PCB microstrip or stripline, without the invention shown below, it is very difficult to meet the designer's timing requirement in the structure shown in FIG. 1(a).

Figure 1B:
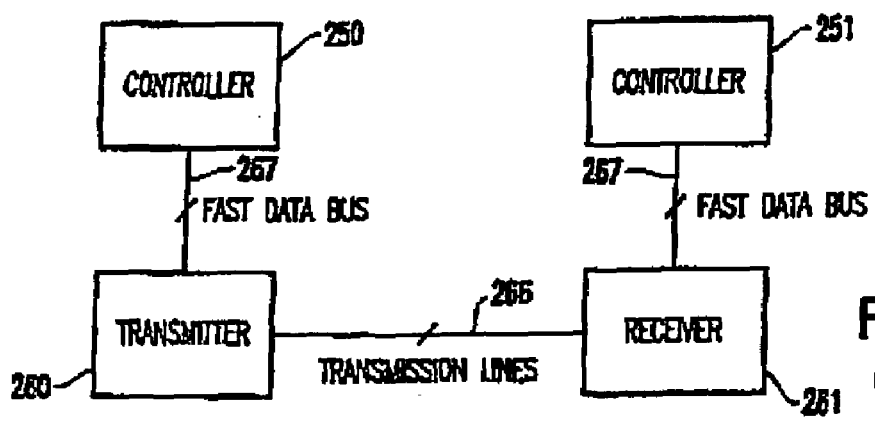
Figure 1C:
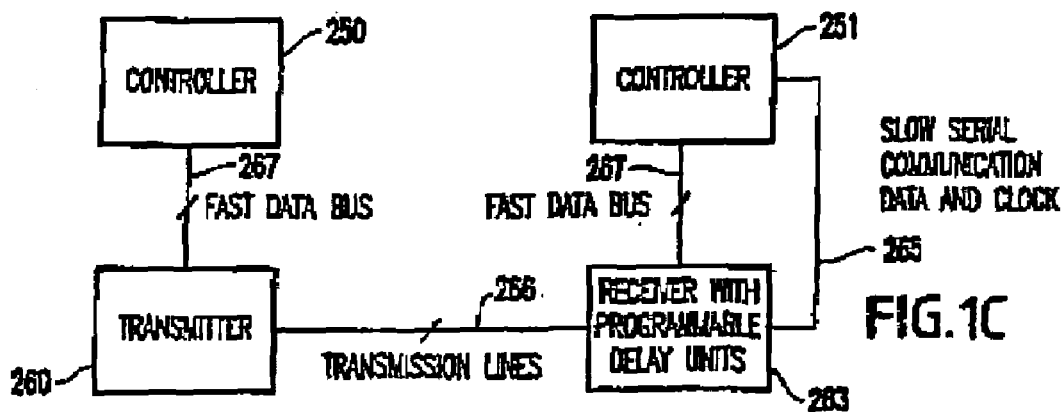

FIG. 1(b) shows two controllers 250, 251 controlling, respectively, a transmitter 260 and a receiver 261 that communicate over transmission lines 266. The fast data communication, such as 40 Gb/s from the controller 250 to the controller 251, is through the transmitter 260, the transmission lines 266, and the receiver 261. In FIG. 1(c), a slow serial communication data and clock signal line 265 is shown in addition to the relatively faster data bases 267. The relatively slower data/clock signal line 265 allows the receiver 263 to include programmable delay units, which allows the invention to adjust signal delay properties "on-chip" and on-line, as discussed in greater detail below.

Figure 2:
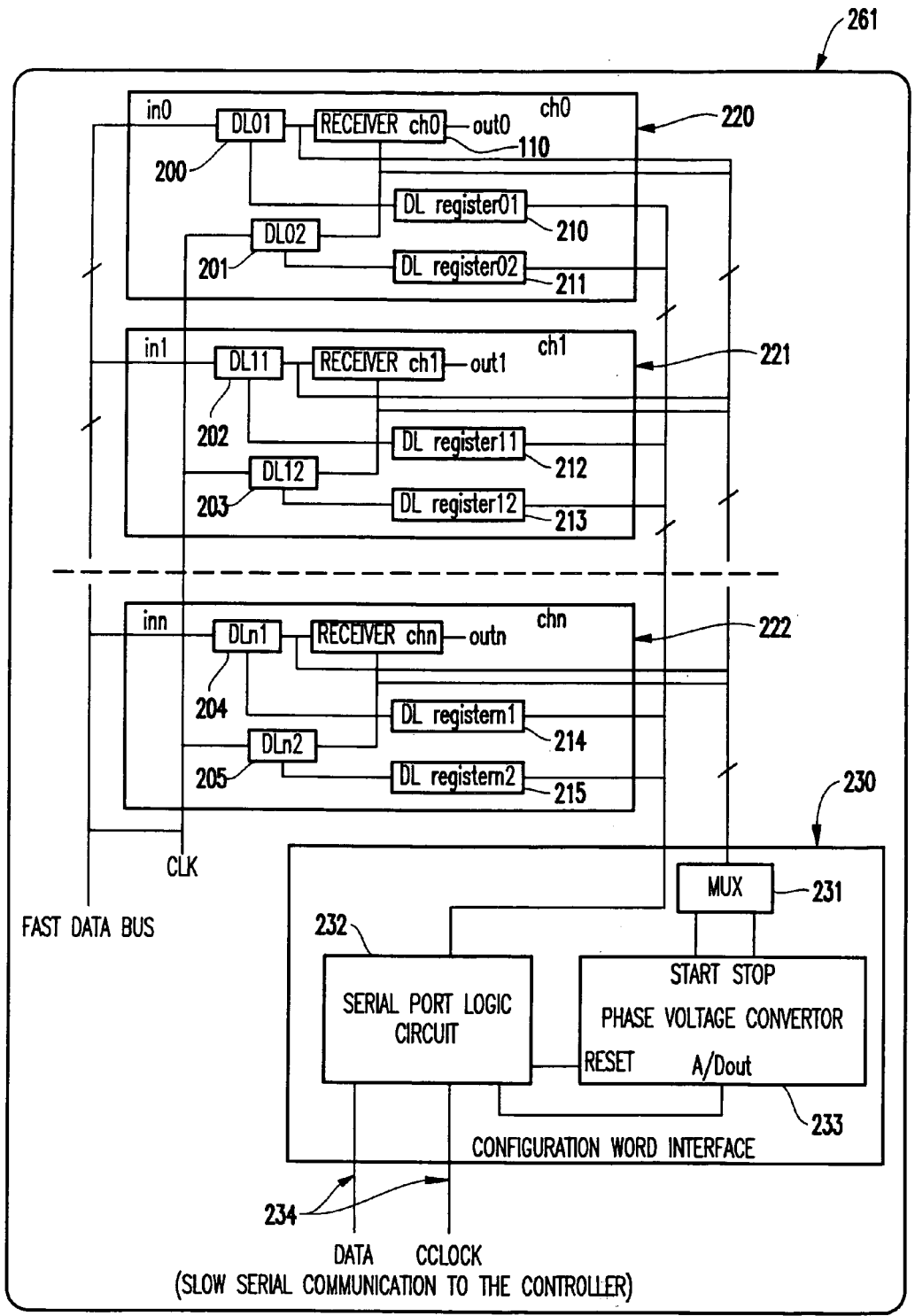
FIG. 2 is a schematic diagram of a first embodiment of the invention showing the programmable delay units and configuration word settings.

FIG. 2 is a block diagram of the receiver 261 with programmable delay units (delay lines) 200 205 and a (configuration word interface 230 In FIG. 2, each receiver channel (220–222) includes two programmable delay units DLn1 (200, 202,204) for input bit signal delay and DLn2 (201,203,205) for clock delay, and two DL registers (delay time set registers) 210 215. The DL register n1 (210, 212, 214) is for the DLn1 programmable delay unit (200, 202, 204) and the DL register n2 (211, 213, 215) is for the DLn2 programmable delay unit (201, 203, 205). The variable "n" is the channel number.

A low speed delay time configuration port 234 connected to data/clock signal line 265 is part of the configuration word interface 230. The configuration word interface 230 has a shift register, a clock counter, a decoder and other control logic 232 that can implement bi-directional communications with the controller. In addition, a multiplexor 231 and phase voltage converter 233 are used in the timing adjustment. The communication instructions contain the information of chip selection, channel selection, signal or clock delay selection, delay time setting, signal-signal alignment operation, signal clock alignment operation, and so on. The configuration word interface 230 is a well-known technology to those ordinarily skilled in this art field.

The configuration port 230 has two pins 234: data and clock (configuration clock). The function of the configuration port 230 is to set the delay time for each programmable delay line by "clocking in" a configuration word to each delay unit 200–205 in serial. With the invention, the timing adjustment is implemented in the system initiation procedure when a PCB card is used for the first time or when any receiver main component is replaced on the PCB card. Also, real-time, on-line timing adjustment between the signal and the clock in the same channel can be implemented, as described below.

Figure 5:
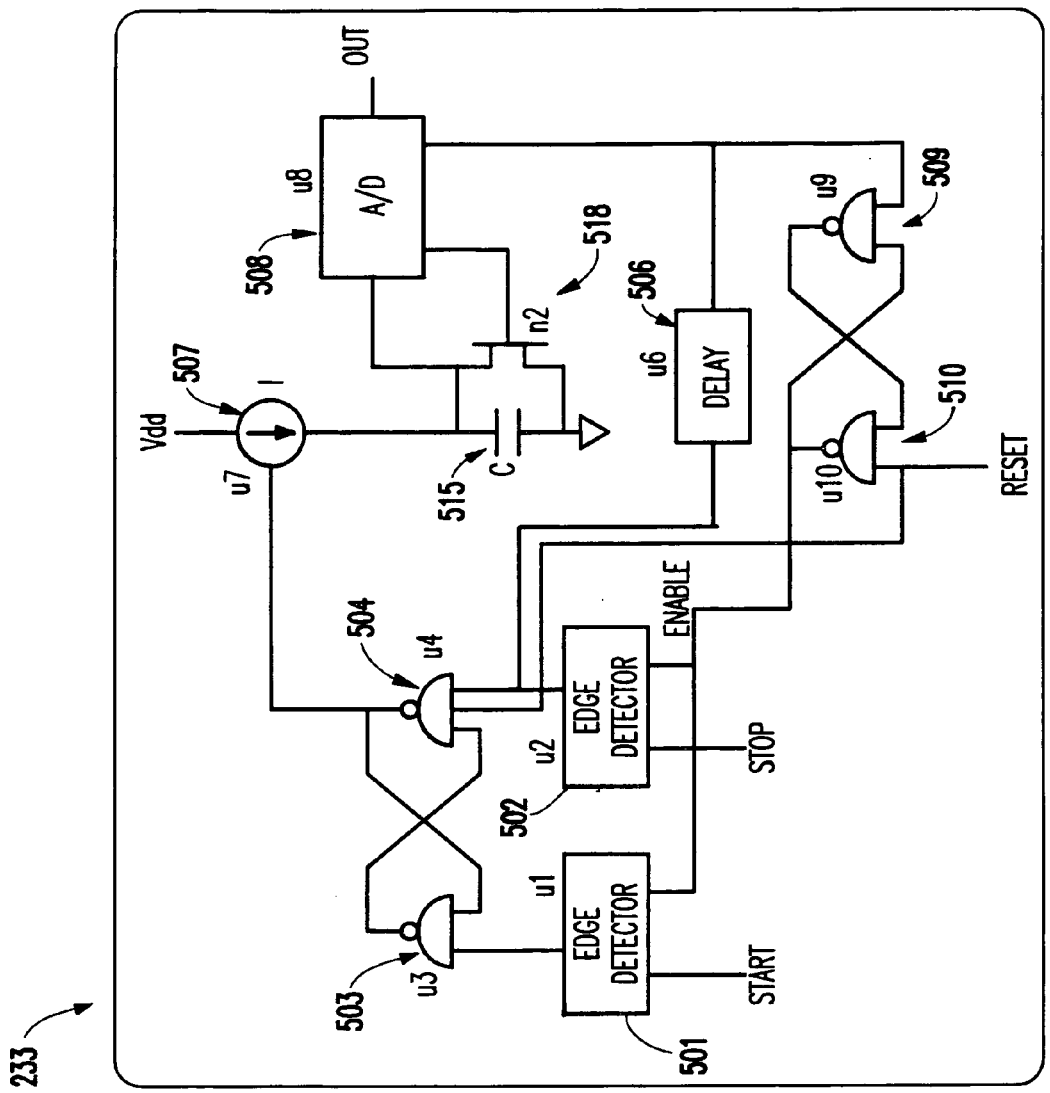
FIG. 5 is a schematic diagram of a timing edge detector circuit.

The timing adjustments mentioned above are divided into two steps. First, the timing adjustment input signal and the clock are modified with respect to each individual channel 220–222 to reach the most stable output (with the maximum jitter margin) for each channel, individually. This is implemented by the configuration word interface 230 clocking configuration words for the input signal and the clock to each channel (e.g., each delay unit 200–205) and monitoring the output waveform of each channel. If the delay time of the input signal is longer than that of the clock, the invention adjusts the clock delay time, otherwise, the invention adjusts the input signal delay time. A phase voltage converter 233 and related logic devices 232 are used to perform this function. One phase voltage converter is shown in FIG. 5.

Figure 3A:
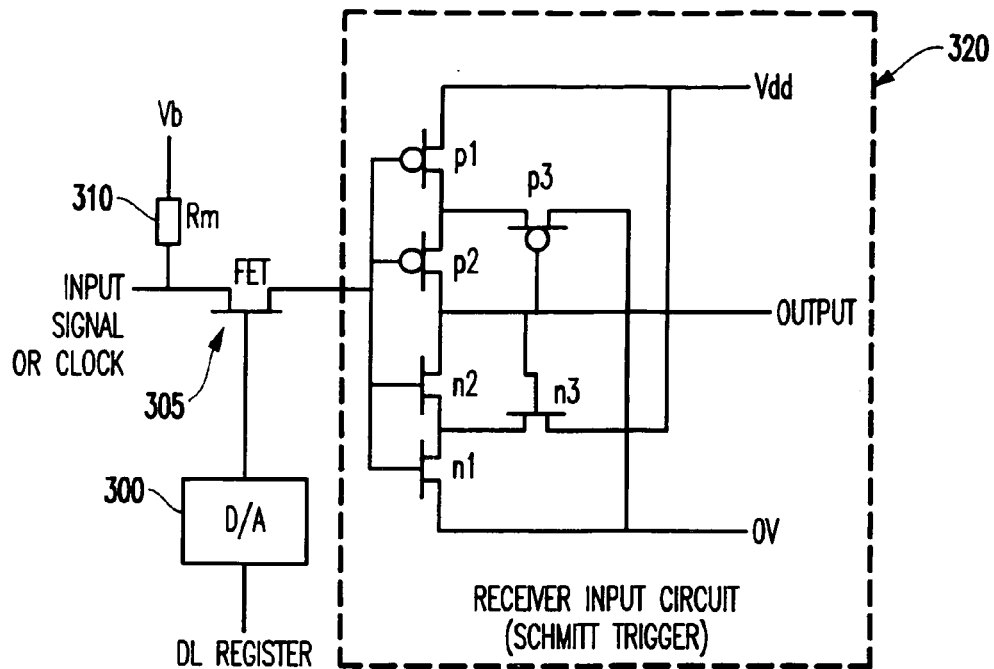
FIG. 3(a) is a schematic diagram of one of the delay units shown in FIG. 2.
Figure 3B:
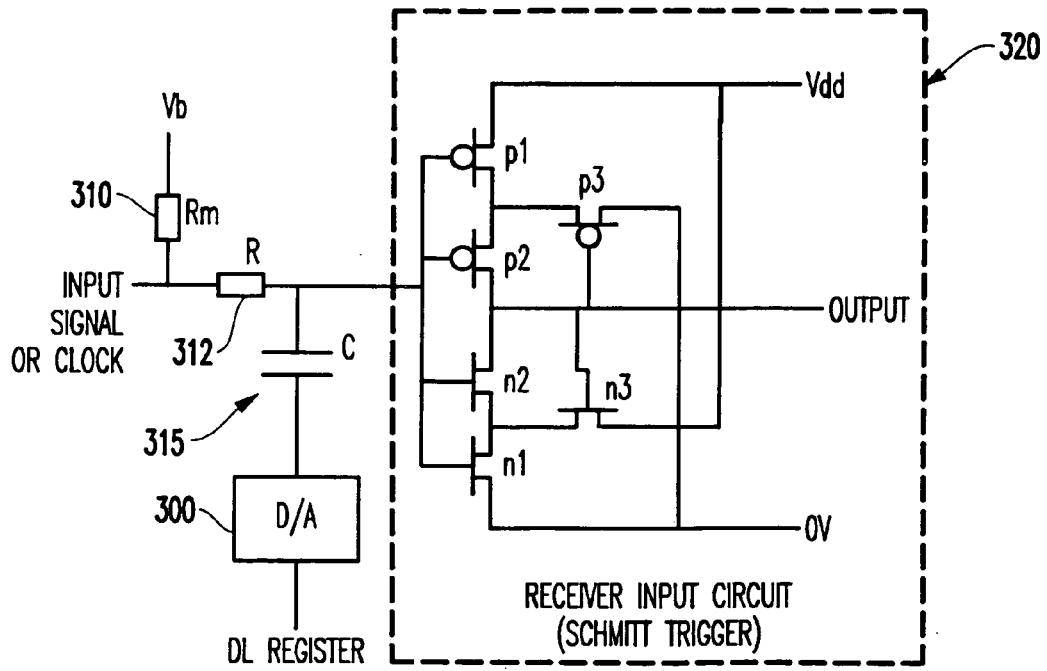
FIG. 3(b) is a schematic diagram of another embodiment of one of the delay units shown in FIG. 2.

The output of the delay time set register 210–215 is connected to the digital input of the D/A (digital-to-analog converter) 300 (see FIGS. 3(a) and (b)), so that the content stored in the delay time set register 210–215 can control the analog output of the D/A 300, which will change the resistance (shown in FIG. 3(a)) or capacitance (shown in FIG. 3(b)) in the RC delay network; then the delay time of the RC delay network is changed according to the content in the delay time set register.

Figure 4:
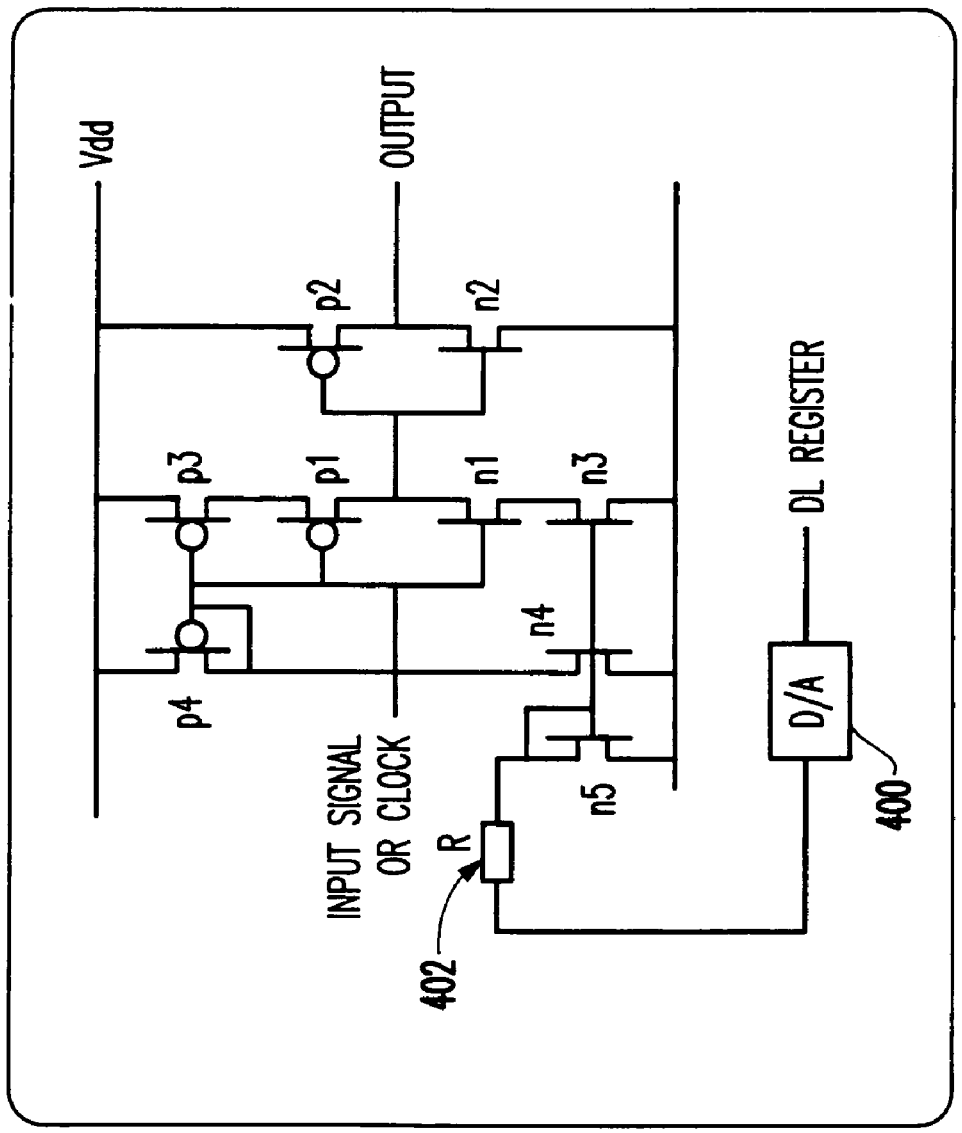
FIG. 4 is a schematic diagram of another embodiment of one of the delay units shown in FIG. 2.

FIGS. 3(a) and 3(b), and FIG. 4, illustrate examples of the delay units 200–205 shown in FIG. 2. The delay units shown in FIGS. 3(a) and 3(b) are more suitable for Low Voltage Differential Signaling (LVDS) which specifies voltage swing of logic high and low 300 mV. In such applications, voltage controlled resistors or voltage controlled capacitors can be used for programmable the delay device, such as FETs or varactors. FIG. 3(a) is a delay unit using a field effect transistor (FET) 305 and digital-to-analog converter (D/A) 300, and a Schmitt trigger 320. A matching resistor 310 (Rm) is used for transmission characteristic impedance matching. The variable Vb is the bias voltage on the receiver side. The resistance between the source and the drain of the FET 305 (Rds) and the input parasitic capacitance of the receiver 320 form an RC time delay network. When the gate voltage is high, Rds is low, and the delay time is short. When the gate voltage is low, Rds is high, and the delay time is long. The D/A 300 controls the FET gate voltage according to the content of the DL register, thereby adjusting the delay of the delay unit shown in FIG. 3(*a*).

The structure shown in FIG. 3(*a*) requires the FET to be in linear operation mode for all gate control voltage ranges, which can be implemented by selecting the proper FET and setting Vb. For example, if a thick oxide, zeroVt FET of CMOS7sf is used, the Vdd can be 3.6 V and the receive input bias is about 1.2 V when the gate voltage varies from 3.6V to 1.5V, Vgs>=Vds. In this situation, the FET operates in a linear region and behaves similarly to a resistor. The Schmitt trigger circuit 320 is used to avoid waveform distortion. As would be known by one ordinarily skilled in the art, any kind of voltage controlled resistor could be used in the delay line.

The delay unit in FIG. 3(*b*) includes a fixed resistor R 312 and a voltage controlled capacitor C 315 in place of the FET 305. The resistor 312 and the capacitor 315 form a RC delay network. When the capacitance of the capacitor 315 C is small, the delay time is short. When the capacitance of the capacitor 315 is large, the delay time is long. Again, the D/A 300 output voltage depends on the content of DL register 210–215 and the output voltage of the D/A 300 controls the capacitance of the capacitor 315, thereby changing the delay time. As would be known by one ordinarily skilled in the art, a varactor or other similar device could be used as the voltage controlled capacitor 315. Similar to the discussion above with respect to FIG. 3(*a*), the proper selection of Vb and the output voltage range of D/A 300 keep the vararctor reverse biased.

The delay unit in FIG. 4 is more suitable for applications with logic voltage swings from 0V to Vdd. The PFETs p1, p2 and NFETs n1 and n2 form two cascade inverters. PFETs p3, p4 and NFETs n3, n4, n5 form two current sources for p1 and n1. When p1 is turned on, the current source p3 provides the current to charge the input capacitance of the second inverter of p2 and n2. When n1 is turned on, the current source n3 provides the current to discharge the input capacitance of the second inverter. When the D/A 400 output voltage changes (through the resistor R 402), the current through n5 changes, and the current of p3 and n3 changes so that the charge or discharge time of the second inverter input capacitance changes, thereby changing the delay time of the second inverter.

The configuration word interface 230 can have a number of configuration word settings. The configuration word settings can be divided into two categories: active and passive. "Active" means the chip adjusts the timing based on its own measurement. "Passive" means the chip adjusts the timing based on the measurement performed outside of the chip. The common structure between the two settings is a low speed, serial communication port 230. The difference between the two settings is that the active configuration word setting has the capability to detect the timing difference on-chip and on-line, while the passive configuration setting changes the delay time according to external information. The active configuration word setting can be used in the applications of all channels in one chip and the passive configuration word setting can be used in the applications of all channels on more than one chip.

Figure 6A:
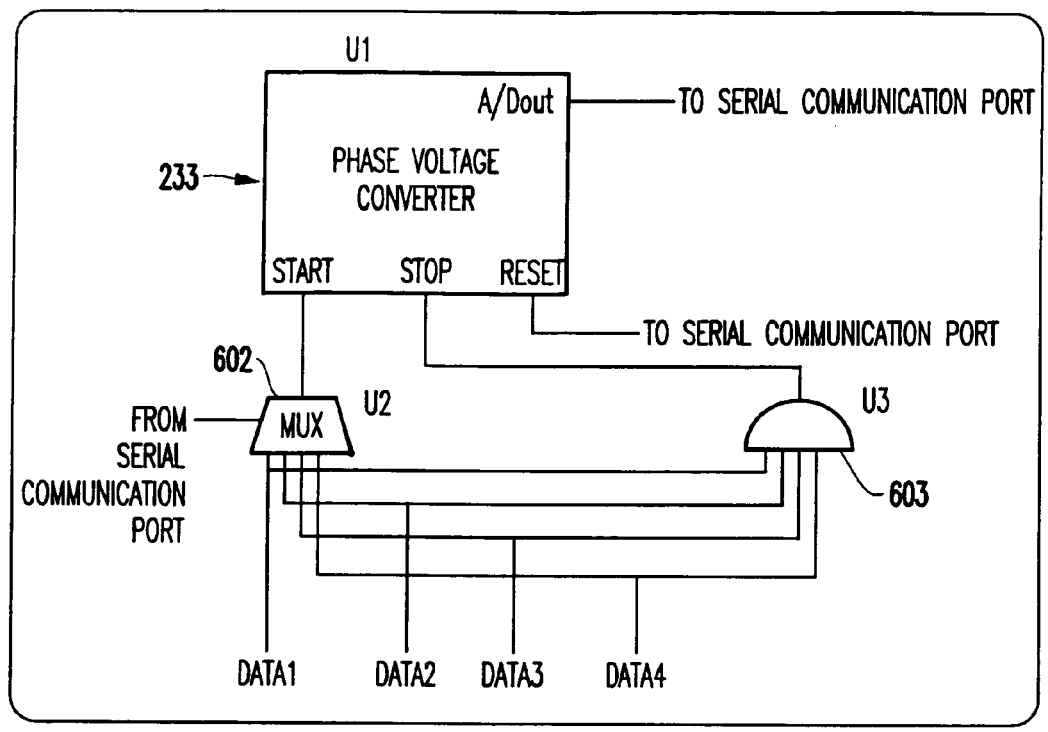
FIG. 6(a) is a schematic diagram of an embodiment of the invention using a phase voltage converter circuit.
Figure 6B:
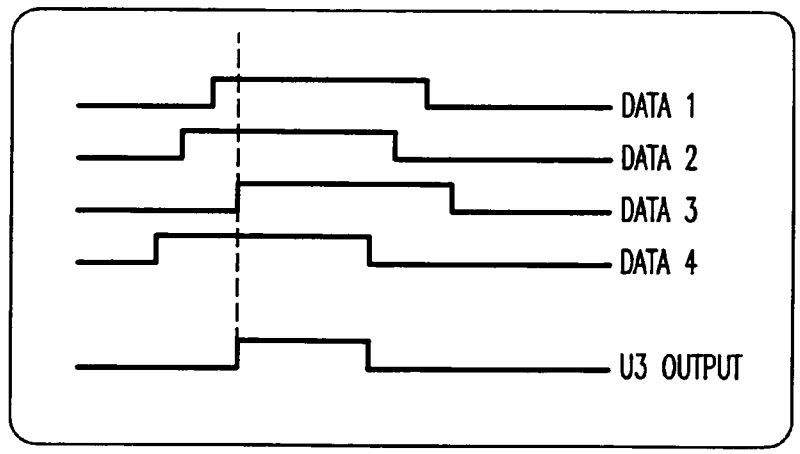
FIG. 6(b) is a timing diagram sharing the operation of the structure shown in FIG. 6(a)
Figure 7:
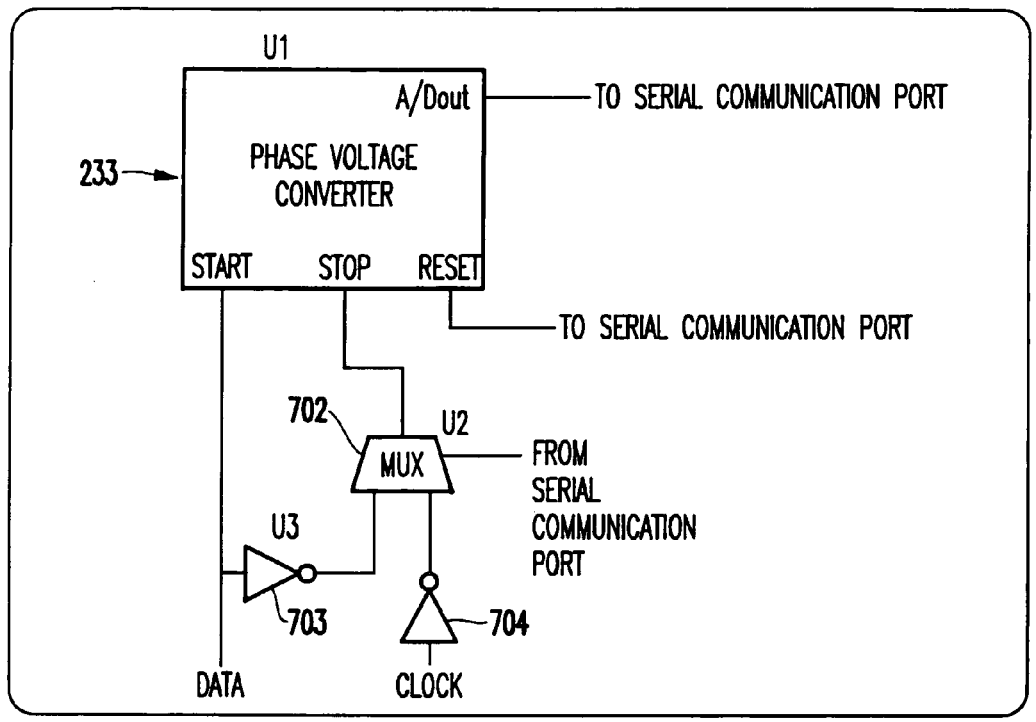
FIG. 7 is a schematic diagram of another embodiment of the invention using a phase voltage converter circuit.

FIG. 5 illustrates the phase voltage converter 233 shown in FIGS. 2, 6 and 7. The active configuration word setting uses a phase voltage converter, a signal-signal alignment unit, and a signal-clock alignment unit. In FIG. 5, u1 (501) and u2 (502) are edge detectors. When the input terminal "start" or "stop" has a logic low to logic high transition, the edge detectors 501, 502 output a narrow negative pulse if the enable terminal is at logic state of high. Units u3 (503) and u4 (504) form a simple RS register. When a low to high transition occurs in the terminal of start u4 (504), output becomes logic high, which turns on the switching current source u7 (507) to charge the capacitor C 515. When a low to high transition occurs in the terminal of stop u4 (504), output becomes logic low, the switching current source u7 (507) is turned off, and the charge to the capacitor 515 is stopped. Thus, voltage across the capacitor is linearly proportional to the time difference or phase difference of the low to high transitions on "start" and "stop."

A negative narrow pulse from u2 (502) passes through the delay unit u6 (506) and triggers the analog-to-digital converter u8 (508) and, at the same time, the RS register of u9 and u10 (509, 510) are triggered. This causes the output from u10 (510) to become logic low, which disables u2 (502) and u3 (503) so that the A/D 508 has enough time to sample the voltage of the capacitor 515. When the analog/digital converter 508 completes the voltage sampling, it sends out the result to the controller 251 through the serial communication port 230. The controller 251 locates the other ends of "data" and "clock" of the configuration word interface in FIG. 1. The A/D 508 also turns on transistor n 2 518 to discharge the capacitor 515. When the analog-to-digital converter 508 senses that the voltage of the capacitor 515 is reduced to the floor (usually lower than the resolution of the A/D), the A/D 508 turns off n 2 518 and sends a message of operation completion to the controller 251 through the serial communication port 230. The controller can start the next operation by resetting the RS registers u9 and u10 (509, 510) through the serial communication port 230.

As mentioned above, the invention performs on-chip and on-line signal-to-signal alignment. More specifically, a signal-to-signal alignment circuit is shown in FIG. 6(*a*). Four channels data 1–data 4 are shown in the example in FIG. 6(*a*); however, those ordinarily skilled in the art would recognize that any number of channels could be used. A phase voltage converter U1 (233) has a start terminal connected to a 1 to 4 multiplexor U2 (602) which selects one of the four data channels to apply to the start terminal according to the signal from the serial communication port 230. As an AND, the output becomes logic high if, and only if, all of the inputs are at logic high, the output of a four input AND gate U 3 (603), which exhibits a logic low to high transition depending on the last low to high transition among data1 to data4, is applied to the stop terminal of the phase voltage converter 233, as seen in FIG. 6(*a*). The invention performs timing adjustment among the channels. The invention takes the slowest channel as a reference, and increases the delay times of other channels to reach the same timing for all channels. An AND gate 603 can be used to identify the slowest channels, which is shown in FIG. 6(*a*). This operation is based on a very well-known logical property of the AND gate 603; that is, the output of an AND becomes logic high if, and only if, all its inputs are at logic high. In the other words, the output of the AND 603 remains logical low until the slowest input (the slowest channel) jumps to logic high. This is shown in the timing diagram in FIG. 6(*b*). The relative timing of the input signal and the clock of each channel is maintained (not altered) in this process. When the adjustment is completed, all of the delay time settings are saved in a non-volatilized memory, (e.g., hard disk or EEPROM).

With the invention, the timing adjustments among the channels (between the channels) can be performed in real-time, on-line, depending on the system requirements, as explained in greater detail below. The data signals should be taken from right before the sampling circuit or from the channel outputs. Before this alignment, all of the signal delay line registers (210–215) are set to the initial values for minimum delay time, which is called the "initial delay time" of each signal. During this alignment, the transmitter 260 sends the same data streams of all channels under control of the controller 251.

When a data channel is selected, if it was the one with the longest initial delay time used, the A/D output from the phase voltage converter 233 will be near zero, and the associated delay line register does not need to change the content. If the selected data channel is not the one with the longest initial delay time, the phase difference between the selected one and the one with the longest delay time is detected by the phase voltage converter 233, and the A/D output sends the information to the controller 251 through the serial communication port 230. In this situation, the controller 251 changes the data channel signal delay line register 210–215 content to increase the delay time. Then, the data channel is tested again until the phase voltage converter 233 output is less than the A/D resolution. Because of random jitter, the content of signal delay register for zero phase differences may not be constant. Therefore, the invention repeats this process several times and takes the average value. The same procedure is applied to all other channels. When this process is completed, all signal data channels 220–222 will have the same timing. All of the content of the signal delay line registers 210–215 are saved in a non-volatilized memory, e.g., hard disk or EEPROM.

Therefore, through the use of a phase voltage converter 233, the invention can make adjustments to the manufactured device on-chip and on-line. This allows customers to adjust the timing of devices on the chip to accommodate their specific uses after the chip has been delivered (as opposed to requiring the chip manufacturer to make the timing adjustments during the chip design/manufacturing process). Further, this allows a customer to purchase one type of chip and to make different timing adjustments on the chips for the different applications that the customer may have for the chips.

On-line signal-to-signal alignment relies on the run length number. Therefore, the signal timing differences among channels will have several discreet values. When the controller 251 selects two signals of different channels and sends them to the phase voltage converter 233, the output voltage should be one of the discreet values. If the output is not one of the discreet values, the phase voltage converter 233 is used (as described above) to adjust the delay unit of the fist one to reach alignment.

With respect to signal-to-clock alignment, the invention provides the signal-to-clock alignment circuit shown FIG. 7. During signal-clock alignment, transmitters 260 send a data stream of 010101 . . . under the control of the controller 250. In FIG. 7, the signal data is connected to the start terminal of the phase voltage converter U1 (233) and the corresponding clock 704 is connected to the 1 to 2 multiplexor U2 702. Both the signal data (through inverter 703) and the clock signal (from inverter 704) should be taken from just before the receiver inputs (in 0, in 1, . . . in n), shown in FIG. 2.

The signal-clock alignment is completed by first performing a reference phase difference test, which measures the time duration of one bit. In this process, the multiplexor U2 702 selects the output of inverter (703); that is, the inverted data signal, so that one bit duration of the data signal is measured, and a corresponding value is sent from the A/D output in the phase voltage converter 233 to the controller 251 as a reference value of one bit duration.

Once the reference value is established, the multiplexor 702 selects the inverted clock (704) and uses a similar procedure to that described above for signal-to-signal alignment to adjust the clock falling edge (or reading edge) of the clock to a position where the phase voltage converter 233 A/D outputs a value that is half of the reference value; which means that the clock reading edge is at the middle of the data signal. This alignment can be implemented in real-time and on-line because the reference value is established as set forth above.

For the convenience of explanation, the two alignment circuits are shown as being separate in FIGS. 6 and 7. However, in practice, a chip may need only one phase voltage converter and a set of digital circuits to manipulate the functions for all channels, data signals, and clocks.

Figure 8:
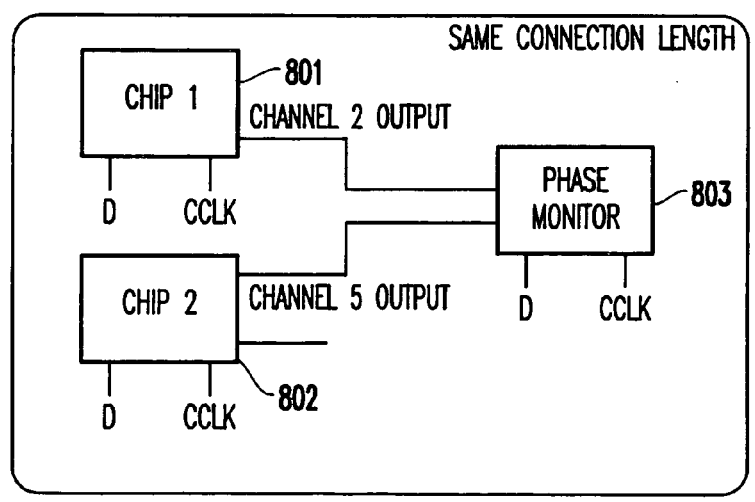
FIG. 8 is a schematic diagram of two chips connected to a phase monitor, according to the invention.

The process of active configuration word setting, which is shown in FIG. 8, is used by the invention to adjust the time delay of a signal or a clock when multiple smaller chips perform the function of a larger chip. For example, when the total channel number required is larger than the number of channels on each chip, multiple chips may be used to achieve the desired number of channels. For example, if 8 channels are required in a system, while each chip can handle only 4 channels, a first chip 801 will handle channels 1 to 4 and a second chip 802 will handle channels 5 to 8. In such a situation, both chips 801, 802 should first, individually, complete the time adjustment of channels 1 to 4 and channels 5 to 8. As shown in FIG. 8, once the timing within each chip is adjusted/corrected, the invention requires that the wiring connection lengths between a phase monitor 803 and the chips 801, 802 should be as similar as possible. For example, the output of channel 2 from chip (801) and the output of channel 5 from chip 2 (802) have the same connection lengths in FIG. 8. The same is true for all wires for all channels. The phase monitor 803 includes a phase voltage converter and a logic circuit for signal-to-signal alignment, which is shown in FIG. 6. In one example, only two inputs could be used. For example, data 1 could be connected to the channel 2 output; and data 2 could be connected to the channel 5 output; which would leave data 3 and data 4 unused (tied-up to logic high). Therefore, with this active configuration word setting, the invention allows multiple, smaller chips to be used as a larger chip. The phase monitor 803 checks signal outputs from different chips. Each chip has the circuits shown in FIGS. 2, 5 and 6(*a*) to check and correct the timing discrepancies of the signals of the chip before checking timing between chips. The configuration word interface 230 preferably The operation of passive configuration word setting is similar to the operation of signal-to-signal alignment. However, with the passive configuration word setting, if the rising edge of a channel in the first chip (e.g., channel 2) is found later than that of channel 5, no timing adjustment is required for the channels in chip 801. Instead, the signal and clock of chip 2 (802) (e.g., channel 5) need timing adjustment according to the phase monitor 803 measurement results. When the adjustment of channel 5 is completed, all other channels in chip 802 need to be adjusted again, taking the new timing of channel 5 as the reference. The device and logic elements shown in FIGS. 5–8 perform these activities, as discussed above.

Therefore, the invention provides timing adjustment that is on-chip and on-line, thereby allowing customers more flexibility in using the chips. As discussed above with respect to FIGS. 6(*a*) and 7, the invention uses the phase voltage converter 233, 701 and on-chip adjustable or programmable delay lines (FIG. 2) to perform on-chip timing adjustment and on-line, real-time timing adjustment. In addition, the invention uses active and passive configuration word settings to allow multiple, smaller devices to be combined into larger devices.

Theoretically, the timing performance in a system is dynamic. This means that the timing of each signal depends, not only on the chip procession and PCB connection length, but also on the power supply voltage and temperature. In real operation, all channels have identical circuits, share the same power supply, and operate at essentially the same temperature; therefore, the changes in power supply voltage and temperatures may not affect the relative timing of signals in a system. However, in some cases, the timing changes are dynamic. For example, in a large receiver chip, the thermal property may not be the same everywhere because some hot spots exist. Thus, the junction temperature of each transistor may not be the same, and different channels may have different timing drifts over the temperatures. Also, in some systems, the data circuits and the clock circuits are not the same, so that they have a different temperature co-efficiency and a different power supply rejection ratio. When the power supply voltage changes or the temperature changes, the timing between data and clock would be changed. As shown above, this invention can adjust the timing in real-time so that it can solve such timing problems dynamically.

Timing is one of the most important quality factors of fast data links. The invention can compensate for timing discrepancies due to various causes such as procession variation, connection length difference, and so on. The invention optimizes the timing within a channel and among channels and, therefore, improves the data link quality. The timing compensation of the invention loosens the tolerances of chip timing requirements, thereby improving chip yield. With the invention, all of the circuits that perform the timing adjustments of channels are in the same chip of the receiver, therefore, no external component is needed. For timing adjustments of channels in different chips, only one chip of the phase monitor is required (803 in FIG. 8); so, the number of the external components is reduced.

While the invention has been described in terms of preferred embodiments, those skilled in the art will recognize that the invention can be practiced with modification within the spirit and scope of the appended claims.

What is claimed is:

1. An apparatus for maintaining signal integrity between integrated circuits residing on a printed circuit board, said apparatus comprising:
    adjustable delay circuitry within said circuits, said adjustable delay circuitry being adjusting timing of signals processed within said circuits;
    a phase monitor connected to said circuits, said phase monitor detecting phase differences between signals output by said circuits; and
    delay time set registers connected to said delay circuitry and said phase monitor, said delay time set registers adjusting said delay circuitry to compensate for said phase differences.

2. The apparatus in claim 1, further comprising:
    first data lines connecting said circuits to each other; and
    second data lines connecting said delay time set registers to said circuits,
    wherein said second data lines transmit data at a slower rate than said first data lines.

3. The apparatus in claim 1, further comprising a serial data line connecting said delay time set registers to said circuits.

4. An apparatus for maintaining signal integrity between integrated circuits residing on a printed circuit board, said apparatus comprising:
    adjustable delay circuitry within said circuits, said adjustable delay circuitry adjusting timing of signals processed within said circuits:
    a phase monitor connected to said circuits, said phase monitor detecting phase differences between signals output by said circuits; and
    a controller connected to said delay circuitry and said phase monitor, said controller adjusting said delay circuitry to compensate for said phase differences,
    wherein at least one of said circuits comprises a receiver circuit, said receiver circuit comprising:
    a plurality of channels; and
    a configuration word interface connected to said channels and to said controller,
    wherein said adjustable delay circuitry comprises at least one adjustable delay device within each of said channels, and
    wherein said configuration word interface controls said delay device to coordinate a signal timing of said channels.

5. The apparatus in claim 4, further comprising delay registers between said delay device and said configuration word interface, wherein said delay registers store information regarding timing delay of an associated delay device.

6. The apparatus in claim 4, wherein said configuration word interface is connected to said controller and said controller supplies information to control said delay device.

7. The apparatus in claim 4, wherein said configuration word interface permits dynamic control of said delay device.

8. The apparatus in claim 4, wherein said configuration word interface includes a phase voltage converter.

9. The apparatus in claim 4, wherein said adjustable delay device comprises:
    a resistor-capacitor network;
    a Schmitt trigger connected to said resistor-capacitor network; and
    a digital-to-analog converter connected to said resistor-capacitor network.

10. The apparatus in claim 4, wherein said adjustable delay device comprises:
    a resistor-capacitor network;
    variable transistors connected to said resistor-capacitor network; and
    a digital-to-analog converter connected to said resistor-capacitor network.

11. A method of coordinating timing signals within circuits on a printed circuit board, said method comprising;
    detecting phase differences between signals output by said circuits using a phase monitor: and
    adjusting delay circuitry within said circuits to compensate for said phase differences using a controller,
    wherein at least one of said circuits comprises a receiver circuit, and said adjusting process comprises transmitting control information from said controller through a configuration word interface to said delay circuitry devices to coordinate a signal timing of one of a plurality of said channels of said receiver circuit.

12. The method in claim 11, further comprising dynamically controlling said delay circuitry using said configuration word interface.

13. The method in claim 11, further comprising storing delay information in delay time set registers.

14. The method in claim 13, wherein first data lines connecting said delay time set resisters to said circuits transmit data at a slower rate than second data lines connecting said circuits to each other.

15. The method in claim 13, further comprising using a serial data line to connect said delay time set registers to said circuits.

* * * * *